(12) United States Patent
Nielsen

(10) Patent No.: US 12,348,208 B2
(45) Date of Patent: Jul. 1, 2025

(54) FAST FREQUENCY SWITCHING IN A VARIABLE RF FILTER

(71) Applicant: Anlotek Limited, London (GB)

(72) Inventor: Jorgen Staal Nielsen, Calgary (CA)

(73) Assignee: Anlotek Limited, London (GB)

( * ) Notice: Subject to any disclaimer, the term of this patent is extended or adjusted under 35 U.S.C. 154(b) by 487 days.

(21) Appl. No.: 17/743,387

(22) Filed: May 12, 2022

(65) Prior Publication Data

US 2022/0376671 A1    Nov. 24, 2022

Related U.S. Application Data

(60) Provisional application No. 63/187,854, filed on May 12, 2021.

(51) Int. Cl.
| | | |
|---|---|---|
| *H03H 7/01* | (2006.01) | |
| *H03J 3/20* | (2006.01) | |
| *H03J 1/00* | (2006.01) | |

(52) U.S. Cl.
CPC ............ *H03H 7/0153* (2013.01); *H03J 3/20* (2013.01); *H03J 1/0033* (2013.01); *H03J 2200/32* (2013.01)

(58) Field of Classification Search
CPC ......... H03H 7/0153; H03J 3/20; H03J 1/0033
USPC ........................................ 333/175, 176, 181
See application file for complete search history.

(56) References Cited

U.S. PATENT DOCUMENTS

| | | |
|---|---|---|
| 1,570,771 A | 1/1926 | Nyquist |
| 1,778,085 A | 10/1930 | Nyquist |
| 1,915,440 A | 6/1933 | Nyquist |
| 1,926,169 A | 9/1933 | Nyquist |
| 2,099,769 A | 11/1937 | Nyquist |
| 3,720,881 A | 3/1973 | Hurtig, III |

(Continued)

FOREIGN PATENT DOCUMENTS

| | | |
|---|---|---|
| CN | 102098018 A | 6/2011 |
| CN | 104538714 A | 4/2015 |

(Continued)

OTHER PUBLICATIONS

Anis, M., et al., "Fully Integrated Super-Regenerative Bandpass Filters for 3.1-to-7GHz Multiband UWB System," Proceedings of the IEEE International Symposium on VLSI Design, Automation and Test (VLSI-DAT), Apr. 23-25, 2008, Hsinchu, Taiwan, 4 pages.

(Continued)

*Primary Examiner* — Rakesh B Patel
(74) *Attorney, Agent, or Firm* — CHRISTENSEN O'CONNOR JOHNSON KINDNESS PLLC

(57) ABSTRACT

An RF signal is tuned by: producing a first signal at a first frequency using a digital sequence generator; filtering the first signal using a frequency-tunable tracking filter that is tuned to the first frequency, the tracking filter comprising one or more variable resonators; tuning the tracking filter from the first frequency to a second frequency over a transition period; and tuning the first signal to the second frequency by causing the digital sequence generator to transition between two or more states during the transition period. The two or more states are selected such that, immediately after the transition period, the analog signal substantially matches a desired steady state at the second frequency.

14 Claims, 9 Drawing Sheets

(56) References Cited

U.S. PATENT DOCUMENTS

| | | | |
|---|---|---|---|
| 5,220,686 | A | 6/1993 | Kasperkovitz et al. |
| 5,291,159 | A | 3/1994 | Vale |
| 5,311,198 | A | 5/1994 | Sutton |
| 5,854,593 | A | 12/1998 | Dykema et al. |
| 5,917,387 | A | 6/1999 | Rice et al. |
| 5,949,290 | A | 9/1999 | Bertram |
| 6,057,735 | A | 5/2000 | Cloutier |
| 6,236,281 | B1 | 5/2001 | Nguyen et al. |
| 6,420,913 | B1 | 7/2002 | Freeman |
| 6,452,465 | B1 | 9/2002 | Brown et al. |
| 6,496,075 | B2 | 12/2002 | Justice et al. |
| 6,587,007 | B2 | 7/2003 | Exeter |
| 6,650,195 | B1 | 11/2003 | Brunn et al. |
| 6,771,147 | B2 | 8/2004 | Mongia |
| 6,865,387 | B2 | 3/2005 | Bucknell et al. |
| 6,898,450 | B2 | 5/2005 | Eden et al. |
| 6,920,315 | B1 | 7/2005 | Wilcox et al. |
| 6,937,877 | B2 | 8/2005 | Davenport |
| 6,941,118 | B2 | 9/2005 | Yamamoto |
| 6,954,774 | B1 | 10/2005 | Mulbrook |
| 7,098,751 | B1 | 8/2006 | Wong |
| 7,151,925 | B2 | 12/2006 | Ting et al. |
| 7,158,010 | B2 | 1/2007 | Fischer et al. |
| 7,174,147 | B2 | 2/2007 | Toncich et al. |
| 7,346,330 | B2 | 3/2008 | Kawabe et al. |
| 7,400,203 | B2 | 7/2008 | Ojo et al. |
| 7,414,779 | B2 | 8/2008 | Huber et al. |
| 7,423,502 | B2 | 9/2008 | Razafimandimby et al. |
| 7,433,668 | B2 | 10/2008 | Fischer et al. |
| 7,509,141 | B1 | 3/2009 | Koenck et al. |
| 7,522,016 | B2 | 4/2009 | Toncich et al. |
| 7,809,410 | B2 | 10/2010 | Palum et al. |
| 7,917,117 | B2 | 3/2011 | Zafonte |
| 7,937,076 | B2 | 5/2011 | Zeller et al. |
| 8,000,379 | B2 | 8/2011 | Kishigami et al. |
| 8,050,708 | B2 | 11/2011 | March et al. |
| 8,103,213 | B2 | 1/2012 | Tolonen |
| 8,106,727 | B2 | 1/2012 | Kawai et al. |
| 8,107,939 | B2 | 1/2012 | Hassan et al. |
| 8,120,536 | B2 | 2/2012 | Lindmark |
| 8,140,033 | B2 | 3/2012 | Chan Wai Po et al. |
| 8,253,514 | B2 | 8/2012 | Kharrat et al. |
| 8,294,537 | B2 | 10/2012 | Kawai et al. |
| 8,565,671 | B2 | 10/2013 | Robert et al. |
| 8,767,871 | B2 | 7/2014 | Park et al. |
| 8,922,294 | B2 | 12/2014 | Tsuzuki et al. |
| 8,981,875 | B2 | 5/2015 | Park |
| 9,024,709 | B2 | 5/2015 | Joshi et al. |
| 9,083,351 | B1 | 7/2015 | Lee et al. |
| 9,129,080 | B2 | 9/2015 | Tsuzuki et al. |
| 9,184,498 | B2 | 11/2015 | Schiller |
| 9,231,712 | B2 | 1/2016 | Hahn et al. |
| 9,407,239 | B2 | 8/2016 | White et al. |
| 9,634,390 | B2 | 4/2017 | Onaka |
| 9,641,138 | B2 | 5/2017 | Zhu |
| 9,698,747 | B2 | 7/2017 | Ishizuka |
| 10,050,604 | B2 | 8/2018 | Nielsen et al. |
| 10,228,927 | B2 | 3/2019 | Choi et al. |
| 10,236,899 | B1 | 3/2019 | Tope et al. |
| 10,396,807 | B1 | 8/2019 | Dai et al. |
| 11,290,084 | B2 | 3/2022 | Nielsen et al. |
| 2001/0043116 | A1 | 11/2001 | Waltman |
| 2004/0030108 | A1 | 2/2004 | Pihlava et al. |
| 2005/0003785 | A1* | 1/2005 | Jackson .......... G01S 7/35 455/260 |
| 2007/0010217 | A1 | 1/2007 | Takahashi et al. |
| 2007/0195915 | A1 | 8/2007 | Ko et al. |
| 2007/0296513 | A1 | 12/2007 | Ruile et al. |
| 2009/0322445 | A1 | 12/2009 | Raidl et al. |
| 2010/0097152 | A1 | 4/2010 | Wang et al. |
| 2010/0141355 | A1 | 6/2010 | Kharrat et al. |
| 2011/0002080 | A1 | 1/2011 | Ranta |
| 2011/0187448 | A1 | 8/2011 | Koechlin |
| 2013/0065542 | A1 | 3/2013 | Proudkii |
| 2013/0142089 | A1 | 6/2013 | Azarnaminy et al. |
| 2013/0293291 | A1 | 11/2013 | Shanan |
| 2014/0266454 | A1 | 9/2014 | Testi et al. |
| 2014/0361839 | A1 | 12/2014 | Scott et al. |
| 2016/0072442 | A1 | 3/2016 | Testi et al. |
| 2016/0164481 | A1 | 6/2016 | Madan et al. |
| 2017/0149411 | A1 | 5/2017 | Nielsen et al. |
| 2020/0014382 | A1 | 1/2020 | Ranta |
| 2021/0067125 | A1 | 3/2021 | Nielsen |

FOREIGN PATENT DOCUMENTS

| | | |
|---|---|---|
| CN | 108463949 B | 7/2022 |
| EP | 1675263 A1 | 6/2006 |
| EP | 3062442 A1 | 8/2016 |
| GB | 2 403 086 A | 12/2004 |
| GB | 2 478 585 A | 9/2011 |
| GB | 2 494 652 A | 3/2013 |
| WO | 01/89081 A2 | 11/2001 |
| WO | 02/087071 A2 | 10/2002 |
| WO | 2009114123 A2 | 9/2009 |
| WO | 2011/103108 A1 | 8/2011 |
| WO | 2015/176041 A1 | 11/2015 |

OTHER PUBLICATIONS

Anis, M., et al., "Low Power Complementary-Colpitts Self-Quenched Super-Regenerative Ultra-Wideband (UWB) Bandpass Filter in CMOS Technology," Proceedings of the IEEE MTT-S International Microwave Symposium Digest, Jun. 15-20, 2008, Atlanta, pp. 1047-1049.

Bahl, I.J., "High-Performance Inductors," IEEE Transactions on Microwave Theory and Techniques 49(4):654-664, Apr. 2001.

Bhattacharya, A., et al., "A 1.3-2.4-GHz 3.1-mW VCO Using Electro-Thermo-Mechanically Tunable Self-Assembled MEMS Inductor on HR Substrate," IEEE Transactions on Microwave Theory and Techniques 63(2):459-469, Feb. 2015.

Chen, J.-Y., et al., "A Fully Integrated Auto-Calibrated Super-Regenerative Receiver in 0.13-μm CMOS," IEEE Journal of Solid-State Circuits 42(9):1976-1985, Sep. 2007.

Chen, Y.-M., et al., "A 1-1.5 GHz Broadband Tunable Bandpass Filter," Proceedings of the Asia-Pacific Microwave Conference (APMC), Kaohsiung, Taiwan, Dec. 4-7, 2012, pp. 738-740.

Duncan, R., et al., "A Q-Enhanced Active-RLC Bandpass Filter," IEEE Transactions on Circuits and Systems—II: Analog and Digital Signal Processing 44(5):341-347, May 1997.

Entesari, K., et al., "A 25-75-MHz RF MEMS Tunable Filter," IEEE Transactions on Microwave Theory and Techniques 55(11):2399-2405, Nov. 2007.

Frey, D.R., "Improved Super-Regenerative Receiver Theory," IEEE Transactions on Circuits and Systems—I: Regular Papers 60(12):3267-3278, Dec. 2013.

Georgescu, B., et al., "Tunable Coupled Inductor Q-Enhancement for Parallel Resonant LC Tanks," IEEE Transactions on Circuits and Systems—II: Analog and Digital Signal Processing 50(10):705-713, Oct. 2003.

Golaszewski, A., and A. Abramowicz, "Voltage Tunable Bandpass Filter," Proceedings of the Signal Processing Symposium (SPSympo), Debe, Poland, Jun. 10-12, 2015, 4 pages.

Guyette, A.C., "Alternative Architectures for Narrowband Varactor-Tuned Bandpass Filters," Proceedings of the European Microwave Conference (EuMC), Rome, Sep. 29-Oct. 1, 2009, pp. 1828-1831.

He, X., and W.B. Kuhn, "A Fully Integrated Q-Enhanced LC Filter With 6 dB Noise Figure at 2.5 GHz in SOI," Proceedings of the IEEE Radio Frequency Integrated Circuits (RFIC) Symposium, Fort Worth, Texas, Jun. 6-8, 2004, pp. 643-646.

International Search Report and Written Opinion mailed Feb. 8, 2017, issued in corresponding International Application No. PCT/GB2016/053686, filed Nov. 23, 2016, 10 pages.

Kuhn, W.B., et al., "Q-Enhanced LC Bandpass Filters for Integrated Wireless Applications," IEEE Transactions on Microwave Theory and Techniques 46(12):2577-2586, Dec. 1998.

Luo, X., et al., "Tunable Bandpass Filter With Two Adjustable Transmission Poles and Compensable Coupling," IEEE Transactions on Microwave Theory and Techniques 62(9):2003-2013, Sep. 2014.

(56) References Cited

OTHER PUBLICATIONS

Nosrati, M., and Z. Atlasbaf, "A New Miniaturized Electronically Tunable Bandpass Filter," Proceedings of the Seventh International Symposium on Antennas, Propagation & EM Theory (ISAPE '06), Guilin, China, Oct. 26-29, 2007, 5 pages.
Piazza, G., "MEMS Resonators for Frequency Control and Sensing Applications," presentation, University of Pennsylvania, Philadelphia [at least as early as Apr. 24, 2015], 104 pages.
Psychogiou, D., et al., "V-Band Bandpass Filter With Continuously Variable Centre Frequency," IET Microwaves, Antennas & Propagation 7(8):701-707, Jun. 2013.
Quednau, P., et al., "A Small Size Low Cost Electronically Tunable Bandpass Filter With Integrated Bias Control," Proceedings of the IEEE International Conference on Microwaves, Communications, Antennas and Electronic Systems (COMCAS), Tel Aviv, Israel, Oct. 21-23, 2013, 4 pages.
Ramadan, A.H., et al., "A Narrowband Frequency-Tunable Antenna for Cognitive Radio Applications," Proceedings of the Sixth European Conference on Antennas and Propagation (EuCAP), Mar. 26-30, 2012, Prague, 5 pages.
Ramadan, A.H., et al., "A Tunable Filtenna for Cognitive Radio Applications," Proceedings of the Ninth European Conference on Antennas and Propagation (EuCAP), Apr. 13-17, 2015, Lisbon, Portugal, 2 pages.
Soorapanth, T., and S.S. Wong, "A 0-dB IL 2140 ± 30 MHz Bandpass Filter Utilizing Q-Enhanced Spiral Inductors in Standard CMOS," IEEE Journal of Solid-State Circuits 37(5):579-586, May 2002.
Sunca, A., et al., "A Wide Tunable Bandpass Filter Design Based on CMOS Active Inductor," Proceedings of the Eighth Conference on Ph.D. Research in Microelectronics and Electronics (PRIME), Session TF3—Microwave and RF, Aachen, Germany, Jun. 12-15, 2012, pp. 203-206.
Wang, S., and R.-X. Wang, "A Tunable Bandpass Filter Using Q-Enhanced and Semi-Passive Inductors at S-Band in 0.18-µM CMOS," Progress in Electromagnetics Research B 28:55-73, 2011.
Written Opinion of the International Preliminary Examining Authority mailed on Feb. 5, 2018, issued in corresponding International Application No. PCT/GB2016/053686, filed Nov. 23, 2016, 6 pages.
He, X., and W.B. Kuhn, "A 2.5-GHz Low-Power, High Dynamic Range, Self-Tuned Q-Enhanced LC Filter in SOI," IEEE Journal of Solid-State Circuits, vol. 40, No. 8, Aug. 2005, 1618-1628.
Gao, W. and W.S. Snelgrove, "A 950MHz Second-Order Integrated LC Bandpass Modulator" 1997 Symposium on VLSI Circuits Digest of Technical Papers, pp. 111-112.
Zumbahlen, Hank: "Chapter 5: Analog Filters ; Section 5-6: Filter Realizations" In: "Op Amp Applications Handbook". Dec. 31, 2005, Newnes, Oxford, pp. 5.59-5.100.
Deliyannis, Theodore L, et al.: "5.6 Multiple-Loop Feedback Filters" In: "Continuous-Time Active Filter Design." Jan. 1, 1999, Boca Raton, FL: CRC Press, U.S. Pat. No. 028,016, pp. 162-171.

\* cited by examiner

FAST FREQUENCY SWITCHING IN A VARIABLE RF FILTER

TECHNICAL FIELD

This relates to tuning an RF signal initiated by a digital sequence generator, and in particular, tuning an RF filter in coordination with the digital sequence generator to reduce the switching time interval when the operating frequency is changed.

BACKGROUND

A digital sequence generator may be used to produce a sequence of digital words that are converted into an analog signal with a high-speed digital to analog converter (DAC). The output is generally an approximation of a sinusoidal signal. Various strategies may be used to produce such a signal as is known in the art. An example of a suitable digital sequence generator is a Direct Digital Sequence (DDS). While this term is used the discussion below, it will be understood that other types of digital sequence generators may also be used. As used herein, the term DDS may include a component that produces an analog signal based on a digitally controlled signal. This may involve a digital sequence generator and a DAC, which may be implemented using separate components, or one or more blocks that perform one or more functions.

Referring to FIG. 1, smoothing out the distortions of the output 18 of a DDS 12 output is equivalent to filtering the desired frequency component of the DDS and suppressing other components. This is done with a tracking filter (TF) 14 that follows the DDS 12. The DDS 12 and tracking filter 14 are controlled by a controller 16 as shown to get the desired filtered sinusoidal RF output 18.

Assume that the DDS produces a time sampled approximation of the sinusoidal signal with a frequency of $f_{DDS}$ that is input to the tracking filter. An example of a typical output is shown in FIG. 2. The output of the DDS is a staircase waveform 15. Also shown is a filtered waveform 17, which is the bandpass version of the DDS signal after the action of the tracking filter 14. The combination of the DDS 12 and the tracking filter 14 may be referred to herein as the DDS-TF.

SUMMARY

According to an aspect, there is provided a method of tuning an RF signal, the method comprising the steps of: producing a first signal at a first frequency using a digital sequence generator; filtering the first signal using a frequency-tunable tracking filter that is tuned to the first frequency, the tracking filter comprising one or more variable resonators; tuning the tracking filter from the first frequency to a second frequency over a transition period; and tuning the first signal to the second frequency by causing the digital sequence generator to transition between two or more states during the transition period, the two or more states being selected such that, immediately after the transition period, the analog signal substantially matches a desired steady state at the second frequency.

According to other aspects, the method may comprise one or more of the following features, alone or in combination: the first signal may be a digital signal filtered to produce an analog signal that is filtered by the tracking filter; the one or more variable resonators may comprise a variable capacitor, such as a varactor having a capacitance that is controlled by a bias voltage; the tracking filter may be tuned from the first frequency to the second frequency by changing the bias voltage; each of the first frequency and the second frequency may be different by greater than 100 MHz and the transition time may be about 500 nanoseconds or less; the tracking filter may be Q-tunable, and may further comprise the step of, during the transition time, tuning the Q of the tracking filter such that a signal amplitude at the second frequency is maintained relative to the first frequency; the method may further comprise the step of tuning the Q of the tracking filter to produce a constant signal amplitude during the transition time; the two or more states may be determined by calibrating the digital sequence generator and the tracking filter, and the method may further comprise the step of storing the two or more states in a calibration table, the calibration table may comprise the two or more states corresponding to a plurality of first frequency and second frequency pairs; the two or more states may be coordinated with changes in the tracking filter during the transition time; calibrating the digital sequence generator and the tracking filter may comprise generating a feedback signal based on samples of at least the analog signal and the RF signal, the samples may be obtained at least during the transition time; calibrating the digital sequence generator and the tracking filter may comprise iteratively applying an optimization algorithm to determine the two or more states for each first frequency and second frequency pair; the set of first frequency and second frequency pairs may be used to determine an empirical relationship that estimates the two or more states for an additional first frequency and second frequency pair that is not stored in the calibration table; the two or more states may be defined by differences in phase, amplitude, frequency, or combinations thereof.

According to an aspect, there is provided a method to reduce the switching time of a transition from an initial frequency ($f_1$) to a destination frequency ($f_2$) as the DDS abruptly changes frequency from $f_1$ to $f_2$ with phase coherence. The tracking filter (TF) also abruptly changes its center band. Starting with a DDS circuit generating a digital signal, a tracking RF filter comprising one or more active feedback analog tunable filters is used to generate the desired frequency output $f_1$. At a subsequent time, the DDS-TF arrive at the desired output frequency $f_2$. We show a reduction in switching time by:

A method of conditioning the DDS samples to minimize the transient behavior of the output RF signal as the DDS and the TF change from a first frequency to a second frequency.

A method for assuring that the signal at $f_2$ after the frequency change is at steady state with the desired output RF signal amplitude.

Other aspects will be apparent from the detailed description and the claims below.

In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION OF PREFERRED EMBODIMENTS

A method of tuning an RF signal will now be described with reference to FIGS. 1 through 16.

Figure 1:
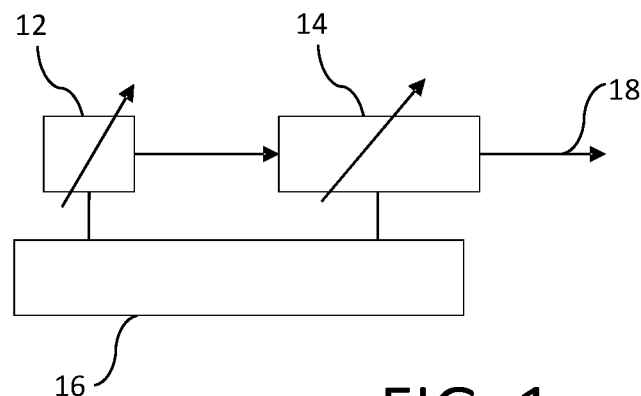
FIG. 1 is a schematic diagram of a DDS and TF.
Figure 2:
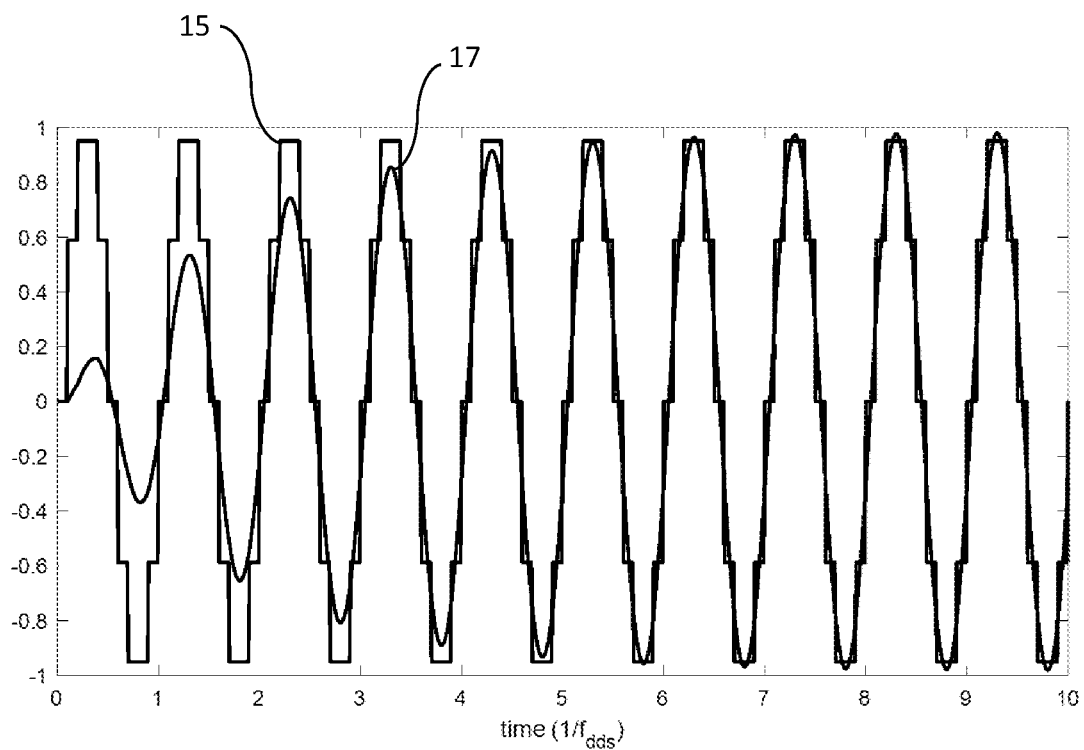
FIG. 2 is a plot showing DDS signal and TF output.
Figure 3:
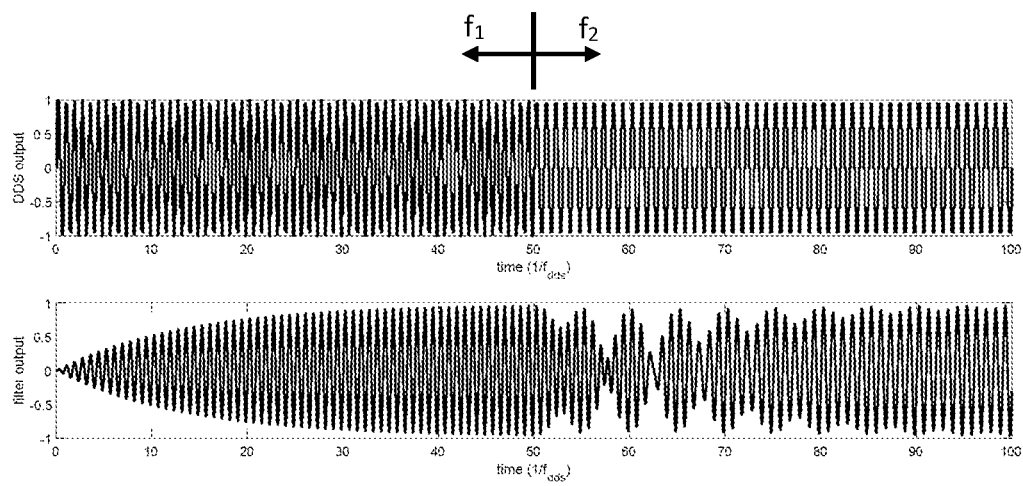
FIG. 3 is a plot of unconstrained DDS transition from an $f_1$ turn-on state at t=0 to a frequency shift of $f_1$ to $f_2$ at t=50, with a transition period after the DDS frequency changes (top) and the tracking filter changes (bottom).

Referring to FIG. 1, a typical DDS 12 generates a sequence of deterministic digital samples into a high-speed DAC. Hence the frequency generated can change instantly. However, the tracking filter 14, used to remove out of band components, is based on analog resonator processing wherein the energy resulting from the initial frequency resides in the resonator while the energy at the new frequency driven from the DDS builds up. Referring to FIG. 3, an example of a DDS output is shown in the top plot, where the frequency is switched from an initial frequency $f_1$ to a destination frequency $f_2$, and the bottom plot is the output of the tracking filter. As can be seen, there is a transition period in the filtered signal after $f_1$ stops and $f_2$ starts where the output is distorted. In this example, $f_1=1$ and $f_2=1.2$ frequency units with a switch time at t=50 time units. The DDS output with a constant amplitude is shown in the top plot of FIG. 3. In the bottom plot, the output of the tracking filter shows that at the point where the filter changes, there is a decay of the first signal at $f_1$ and a build-up of the signal at $f_2$. After t=100 the influence of the residual signal energy from the $f_1$ epoch has decayed leaving essentially only the signal at $f_2$ as driven by the DDS. However, during the transition period of $f_1$ decaying and $f_2$ building up, there is an interaction resulting in the transition region. As a general rule, this region lasts for approximately Q cycles of the RF signal, where Q is the quality factor of the tracking filter (TF).

To provide adequate filtering of the DDS output in circuits that do not incorporate the techniques of this disclosure, the Q of the TF is typically large, such as over 1000. As a numerical example, consider a TF with a Q=1000 and a center frequency of 1.0 GHz. In this case the transition period is on the order of 1 μsec. It is this transition period that is an issue as it slows the switching time of a DDS and consequently the overall switching in frequency from $f_1$ to $f_2$. In contrast, a much shorter transition period, such as on the order of 10 nsec, may result in circuits incorporating the techniques of this disclosure.

DDS Functional Overview

DDS frequency generation may be used in frequency agile applications where it is beneficial to change frequency abruptly with the minimum transient epoch at the point frequency transitions. The TF is necessary to remove spurious frequency components of the DDS output. As used herein, the term abrupt is used to describe an event as occurring over a time interval that is very much less than the signal period of a particular application. Similarly, except where noted, 'instantaneous' is an idealized step change of a parameter such as frequency or varactor bias voltage.

The DDS response, denoted as x(t), for an instantaneous frequency change at t=0 from $f_1$ to $f_2$ is $$x(t) = \begin{cases} A\sin(2\pi f_1 t + \phi_1) t < 0 \\ A\sin(2\pi f_2 t + \phi_2) t > 0 \end{cases}$$

where A is the desired amplitude, $\emptyset_1$ is a desired phase shift for the $f_1$ epoch and $\emptyset_2$ is a desired phase shift for the $f_2$ epoch.

Figure 4:
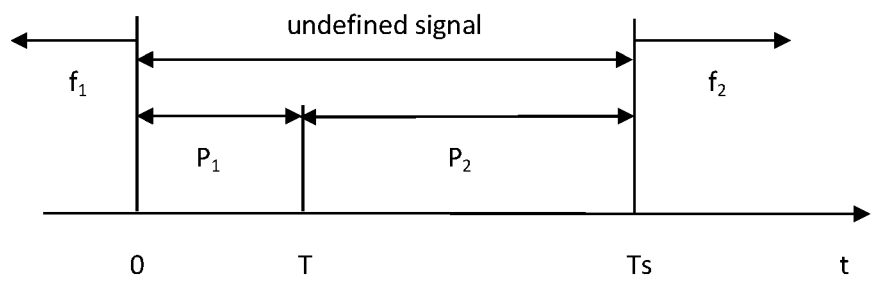
FIG. 4 is a diagram of signal over time showing a switching period broken into two intervals.

Referring to FIG. 4, the transition time of the output RF signal from $f_1$ to $f_2$ may be split into two periods with t=0 the initiation time for the frequency transition epoch from $f_1$ to $f_2$.

The $P_1$ interval from $0<t<T$ is the period over which the TF is reconfigured from a center frequency of $f_1$ to a center frequency of $f_2$.

The $P_2$ interval from $T<t<T_s$ is the transition period where the residual energy from the $f_1$ epoch decays in the $f_2$ epoch as the $f_2$ frequency component builds up.

Due to the settling time of the TF, there will generally be a transition switch time of $T_s$ wherein the output signal x(t) is undefined and hence unusable. Therefore, the implementable combination of the DDS 12 and TF 14 will have an output that may be described by:

$$x(t) = \begin{cases} A\sin(2\pi f_1 t + \phi_1) t < 0 \\ A\sin(2\pi f_2 t + \phi_2) t > T_s \end{cases}$$

The discussion below addresses methods of minimizing the total transition time between T and $T_s$.

Referring to FIGS. 1 and 4, for the purposes of the present discussion, the active control of the DDS 12 and the TF 14, resulting in transition state changes, happen between 0<t<T. If adjustments to the DDS 12 or TF 14 are made in t<0 or t>T, then 0<t<T is the interval over which the adjustments by the DDS control are made and that are finished by t=T, as is tuning the TF from $f_1$ to $f_2$. Through appropriate control of the DDS 12, preferably in coordination with the TF 14, the interval between T and $T_s$ may be substantially reduced, and preferably reduced to a negligible level or reduced entirely. Conceptually, this may be accomplished by using the DDS 12 to assist in the transition, extending over a number of RF cycles, by inserting a number of DDS samples such that the phase of the output signal is managed and aids in the transition of energy storage in the resonator at the start frequency $f_1$ into energy storage at the end frequency $f_2$. The DDS may be programmed with the intermediate states to be used for a given transition from $f_1$ to $f_2$. In determining these states, it should be noted that the DDS is capable of controlling the phase where the transition starts and ends and may be coordinated with the tuning voltages applied to TF.

The DDS makes adjustments with one sequence of digital samples converted by a DAC for the TF signal input, and another sequence of digital samples converted by a DAC for the control of the TF. Adjustment samples are provided between 0<t<T. For t<0 the DDS samples are commensurate with steady state operation at $f_1$, and for t>$T_s$ the DDS samples are likewise commensurate with steady state operation at $f_2$.

If the DDS transition is not ideal, then there will be a small residual transient in the DDS-TF output in t>$T_s$. This transient is what may be eliminated with optimization of the DDS transition states. The determination of these states may be determined, for example, using a calibration method, such as the one discussed below.

The DDS may be considered to progress through one or more intermediate states between 0<t<T. Such intermediate DDS states may include a phase shift and/or a signal amplitude change. Phase shifts may be accomplished by shaping the waveform, such as by inserting or removing digital samples. The states used may be particular to a specific tuning operation, e.g., a specific $f_1$ and $f_2$. Generalizing, the states may be defined by the DDS digital samples in the transition sequence over 0<t<T.

Minimizing the Total Transition Time $T_s$

A typical implementation of a TF is a phase locked loop (PLL), that locks to the DDS output frequency and attempts to transition as fast as possible from $f_1$ to $f_2$. However, even with complex mechanisms to pre-bias the VCO frequency control input and loop filter, achieving sub-microsecond transient times may be very difficult. Also, the PLL may cycle slip during the transition such that phase coherency may be lost in x(t).

Figure 18:
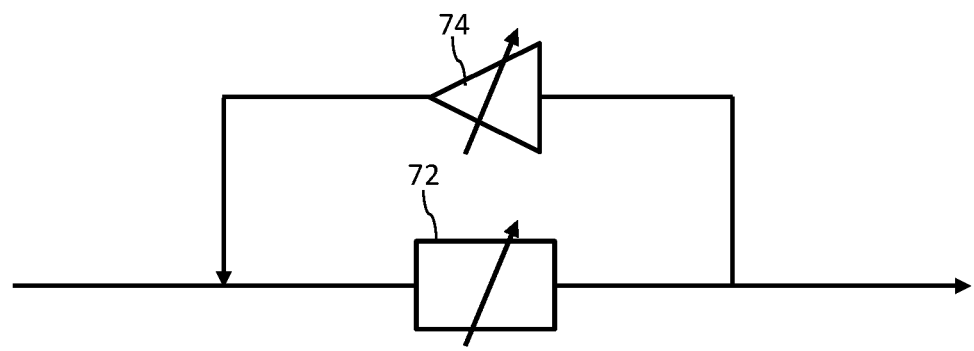
FIG. 18 is an active feedback circuit.

The TF considered in this discussion is the active feedback filter based on a plurality of resonators used in an active feedback loop, and example of which is shown in FIG. 18. This generally involves one or more tunable resonators 72 in a signal loop that includes a variable gain block 74, where the resonator 72 and gain block 74 may be adjusted to control the central frequency and/or the Q of the tracking filter. Other examples of tunable resonators are discussed in U.S. Pat. No. 10,050,604 (Nielsen et al.) entitled "Variable Filter". The resonator(s) 72 may be controlled in frequency based on a variable capacitance, such as a varactor diode, that is appropriately biased to realise the desired passband response of the TF. While varactors are discussed below, it will be understood that other variable capacitors may also be used.

As discussed above, the frequency switching time of $T_s$ consists of two sub-intervals $P_1$ and $P_2$ as illustrated in FIG. 4, which make up an undefined signal between the signal at $f_1$ and $f_2$. The TF configuration interval $P_1$ is constrained by the speed of the TF control electronics, and notably the time required to change the bias voltages of the varactors used in the resonators of the TF. The $P_2$ period, which can be quite long for a narrow bandwidth TF, is the settling time, and the discussion below considers how this may be minimized.

The method discussed herein may be used to reduce or eliminate $P_2$ using appropriate control of the DDS and TF throughout $P_1$. It is based on the following observations:
1. The resonator of the TF maps the energy of the signal at $f_1$ to a frequency $f_2$ when the bias voltage of the varactor(s) of the TF resonator(s) is changed;
2. The DDS output is deterministic, and the response of the TF may also be deterministic when the DDS is coupled with a TF in a highly integrated electronic package;
3. The DDS can drive a DAC to control the TF varactor bias that is synchronized with the DDS output frequency generation;
4. Calibration apparatus is realizable that can accurately measure the response of the TF output to a DDS excitation.

Figure 5:
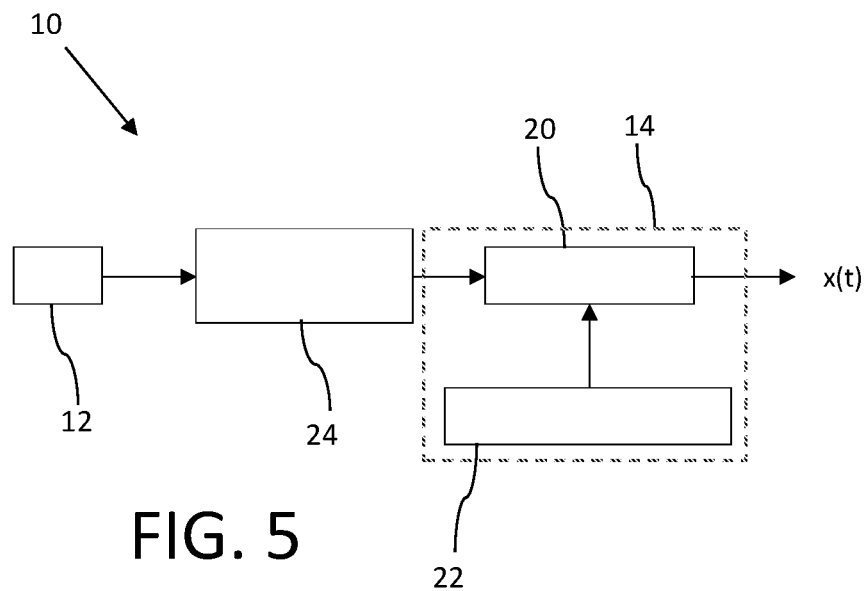
FIG. 5 is a schematic diagram of a DDS driving a DAC input to an LC resonator producing a signal.

Consider the first point of the mapping of the resonator energy when the varactor bias is changed. Referring to FIG. 5, consider a tracking filter 14 in the form of a parallel LC resonator tank 20 with varactor bias control 22 that is driven by a current source 24 from the output of the DDS 12.

TF 14 will have a frequency response approximately equivalent to a single pole resonator as $$H(s) = \frac{2D\omega_0 s}{s^2 + 2D\omega_0 s + \omega_0^2}$$

where D is the damping coefficient and $\omega_0$ is the natural resonance frequency. The Q of the resonator is given as Q=½D. The Q of TF 14 is selected to be sufficiently high that the bandwidth is sufficiently narrow for the DDS application.

The natural resonance frequency is tuned to $f_1$ and $f_2$ by abruptly changing the bias on the varactor of the resonator 20. That is $\omega_0=2\pi f_1$ for the epoch of $f_1$ and is $\omega_0=2\pi f_2$ for the epoch of $f_2$. For the resonator we have $$\omega_0 = \frac{1}{\sqrt{LC}}$$

where C is the total resonator capacitance, including the capacitance of the varactor diode(s) that is a function of the bias voltage v as expressed by C(v). If the bias voltage v(t) could be changed instantly, then C will also change instantly.

Frequency Transition Time ($P_1$)

Ideal Case: Varactor Bias Voltage Changes Instantly

Figure 6:
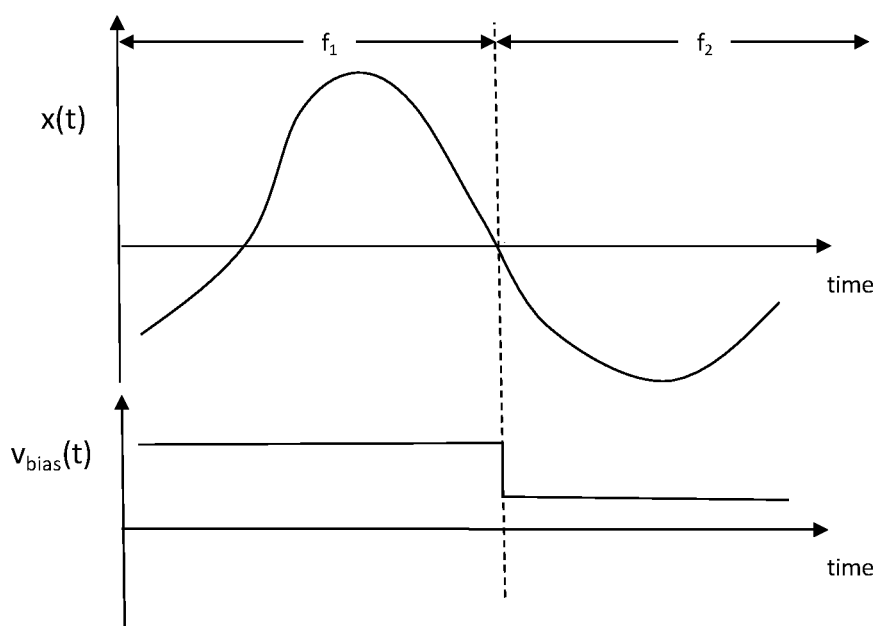
FIG. 6 is a plot showing signal over time for an ideal resonator frequency changing instantaneously with a step change in a variable capacitor.

FIG. 6 shows the sinusoidal signal voltage of x(t) across the varactor capacitor. Assume that exactly at the instance of x(t)=0, the bias v(t) is changed as an abrupt step function as illustrated. A key point is that the energy at this instant is all in the inductive current of the resonator and not in the capacitor. As the capacitor energy is zero, then the capacitor could be changed instantly without at all modifying the signal energy. Hence in the next half cycle the frequency x(t) will correspond to the new value of $1/\sqrt{LC}$. The energy of the frequency at $f_1$ prior to the bias transition would be instantly mapped into the new frequency $f_2$, with no residual energy at $f_1$.

Now consider the DDS excitation into the TF if an ideal TF varactor bias voltage could be changed instantly. If the DDS frequency output is synchronized precisely with the varactor bias voltage step, then the output x(t) would follow $$x(t) = \begin{cases} A\sin(2\pi f_1 t) & t < 0 \\ A\sin(2\pi f_2 t) & t > 0 \end{cases}$$

In this case of instant bias voltage change, the amplitude A would not change from the $f_1$ and $f_2$ epochs. This follows as the input is a current source that at resonance A is given by the product of the amplitude of the DDS synthesized waveform and R, the equivalent parallel resistor of LC resonator tank 20.

Consider what happens in this ideal case if the instantaneous bias voltage is not changed precisely at the zero-voltage crossing of FIG. 6. In this case the change in capacitance will result in a step change in the signal energy. Assuming that the signal energy change cannot occur instantaneously, then a decrease in capacitance will result in an increase in voltage. Hence the phase will change Also, from Q=CV, the energy is $\frac{1}{2}Q^2/C$ which increases. But this amplitude is larger than that sustained from the DDS source and hence there will be an exponential decay of amplitude until the equilibrium point is reached. This transient implies that the interval of $P_2$ is now finite.

Now consider what happens when the ideal TF resonator frequency is not perfectly matched to the DDS. In this case the $f_1$ will be mapped into a new frequency $f_2'$ that is slightly different from $f_2$. This will lead to a beating of the residual energy at $f_2'$ with the new signal at $f_2$ that is being built up. The beat frequency of $f_2'-f_2$ can be small depending on the accuracy. However, the $f_2'$ component will decay in amplitude. The duration of $P_2$ will be on the order of Q frequency cycles which is longer than desired.

Real Case: Varactor Bias Voltage Change over Time

Figure 7:
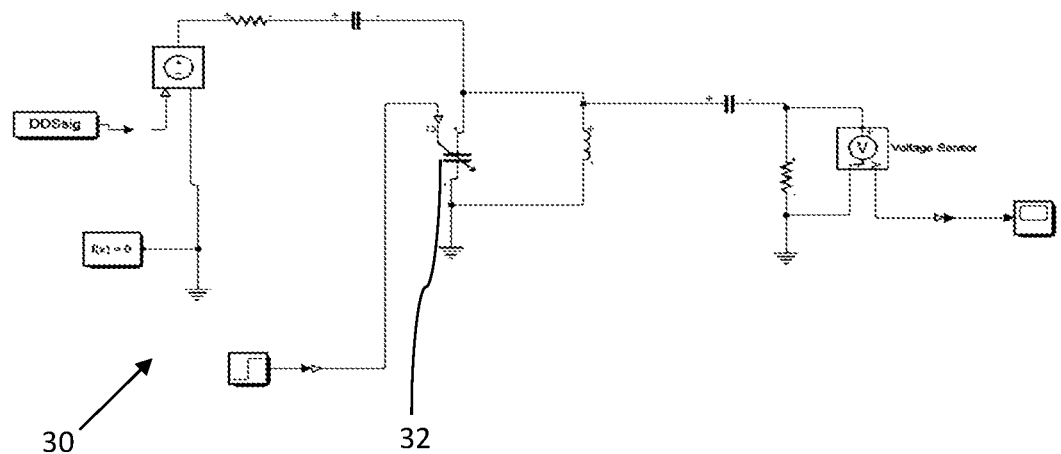
FIG. 7 is a schematic diagram of a resonator with a capacitor that can be changed with time.

Next consider a varactor diode 32 and the associated bias circuitry 30 as shown in FIG. 7. Regarding current technology, varactors are a capacitive element in which a bias control can be applied that can change the capacitance within a short time interval of less than 1 µsec. The varactor effect may also be generated by a MOSFET transistor in a specific circuit architecture. Such devices may be considered varactors, as they require a similar bias circuit and have similar limitations as the two terminal varactor diodes. Other component technologies may also provide fast variable capacitance control. For the purposes of this discussion, referring to a varactor will include varactor diodes as well as any such device where a control input adjusts the capacitance of the device.

Clearly the resonator capacitance C cannot change instantaneously. A key feature of varactor 32 is that the signal and bias are superimposed across the two terminals of the device and cannot be separated. Hence a fast bias change will contribute spectral components within the passband of the signal. However, for microwave frequencies, such spectral contamination leaking into the signal band can be shown to be negligibly small and therefore will not be considered further.

This simplified model of varactor 32 uses a separate port for the capacitor control signal, simplifying simulation as used in this disclosure. This is an approximation as it ignores the injection of the bias signal into the signal passband. Secondly the instantaneous signal energy that is stored in the capacitor is varied by a change in capacitance. In a varactor diode this energy change is driven by the bias.

Figure 8:
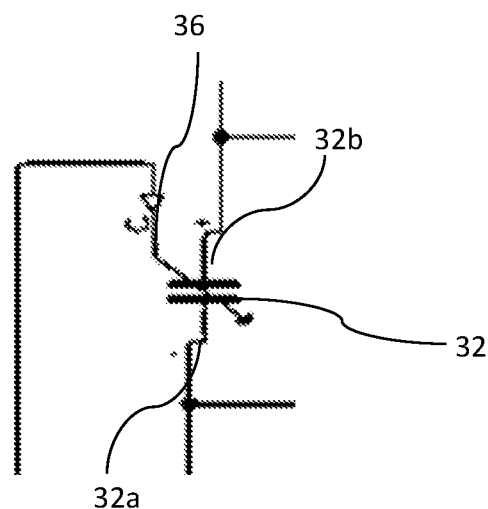
FIG. 8 is a schematic diagram of the capacitor of FIG. 7.

By way of a general discussion, referring to FIG. 8, a capacitor 32 may be considered as a two port element with a first port 32a and a second port 32b in which there is a mechanism for changing the capacitance with a bias from a third port 36. Changing the capacitance does not inject any energy into capacitor 32. The bias and signal may be combined as a potential applied across the two terminal capacitor 32, as in the varactor.

Figure 9:
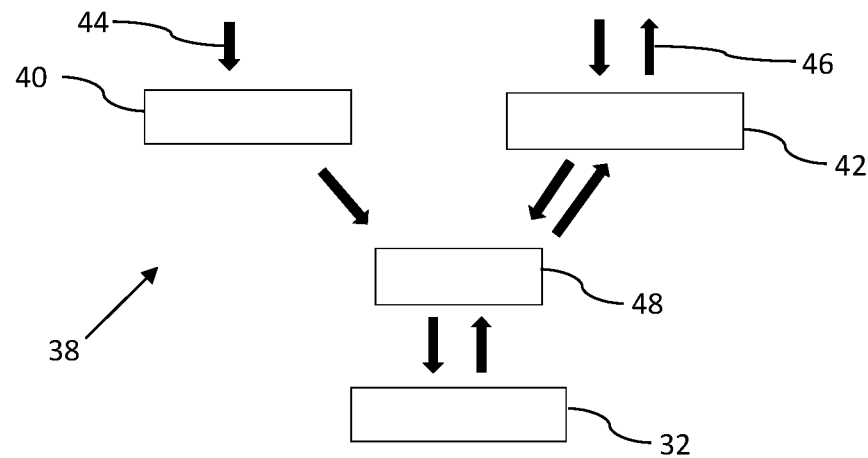
FIG. 9 is a block diagram of an approximation of the varactor circuit with a low pass connection to the bias voltage and a high pass connection to the RF signal.

Referring now to FIG. 9, a sub-circuit 38 of such a device may include a varactor diode 32, a low pass filter 40 that receives the bias voltage 44 and bandpass filter 42 for the signal input/output port 46 that are combined in a combining block 48.

Figure 10:
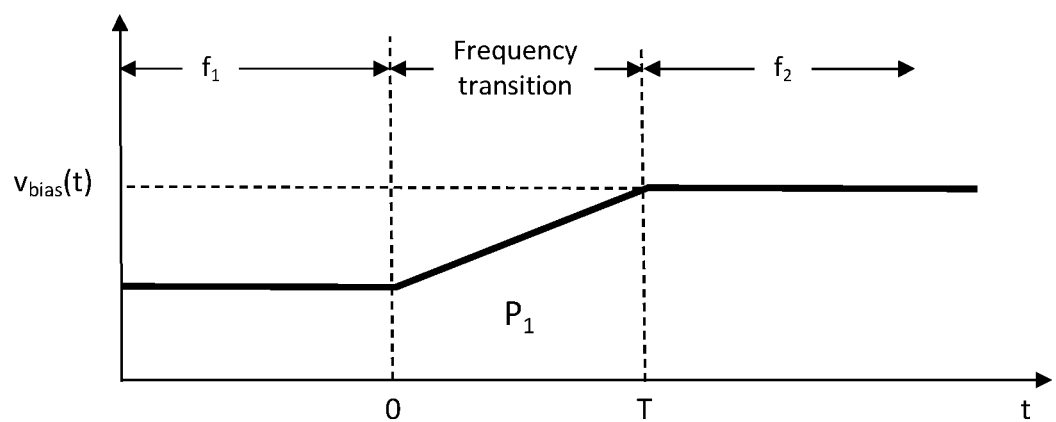
FIG. 10 is a plot of varactor bias voltage over time, showing that varactor bias voltage change is not instantaneous, but occurs during a transition time $P_1$ as the TF resonant frequency changes from $f_1$ to $f_2$.

Referring to FIG. 10, as the varactor bias cannot change instantaneously, there is a frequency transition period during which the varactor bias voltage is changing, where the transition of the bias voltage as the epoch of $f_1$ terminates, followed by a brief transition and then the beginning of the $f_2$ epoch. The varactor bias voltage cannot be changed instantaneously and therefore the finite transition epoch exists for at least several nanoseconds, and in practical bias voltage circuit implementations, 20 to 30 nsec. By matching changes in the DDS to the transition times of the varactor bias voltage, the energy may be mapped between frequencies more efficiently and the overall transition time may be reduced. This may involve one or more transition steps, or in other words, intermediate frequencies or states, between $f_1$ and $f_2$. This involves intermediate states involving the DDS that may correspond with intermediate states of the TF.

General Calibration Overview

DDS 12 generates a sequence of digital samples through the transition over 0<t<T. On either side of the transition period, the samples represent an approximation of the sinusoidal signal at $f_1$ (t<0) and $f_2$ (t>T). Now during the interval 0<t<T, there are a small number of digital samples that the DDS generates based on lookup tables or computation and such, for example, N digital sequence samples.

The calibration of the system may involve the direct optimization of these N values based on the constraint of constant amplitude output in all three regions t<0, 0<t<T and t>T as well as a consistent phase shift in the regions of t<0 and t>T. The N values may be selected as those that arrive at $T_s$, at which point the desired steady state signal strength, frequency, and phase is achieved, as quickly as possible and ideally at $T=T_s$.

Calibration of the Tracking Filter during Frequency Transition Time $P_1$

The DDS begins to generate samples at the frequency of $f_2$ that are in-phase with the residual of the oscillating energy of $f_1$. The frequency change of the DDS may therefore be made abruptly from $f_1$ to $f_2$. The only condition added to the DDS stepping algorithm is that the phase is 0 (or 180 degrees) when $f_1$ ends and that the $f_2$ is 0 degrees (or 180 deg) when it starts. This relative phasing of the DDS between the $f_1$ and $f_2$ epochs is trivial to implement as is the requirement that we stop $f_1$ right at 0 or 180 degrees.

What is a bit more difficult is that practical implementations of resonators will not be ideal. Three possible issues include:

1. A possible delay or phase shift between the DDS DAC current source 24 output and the resonator capacitor 32. This may be exacerbated by the feedback loop of TF 14. A careful equivalent circuit model of the TF 14 may be beneficial.
2. The TF 14 resonator tuning may not be perfect.
3. The TF 14 is an analog RF circuit that may change with environment and aging effects.

These issues may be mitigated by appropriate calibration. This may involve measuring the TF 14 output at $f_1$ and $f_2$ as the capacitance is tuned. This may be done by taking a sampling of the circuit and voltage signals, $i(t)$ and $v(t)$, generating a mixer product of this, and sampling the DC output when the configuration is for a specific frequency, say $f_1$. The samples may be taken at several different values of C from which the precise pole position of the TF can be determined along with any measurement of delay and fixed phase shift. From this we can get the modelling of the TF and then make compensations to the DSS stepping algorithm. These measurements may be stored in a calibration look up table (LUT) for future reference. This may also be used in the $f_1$ to $f_2$ transition, that is, the low pass filter output of the product of $v(t)$ $i(t)$ may be sampled during the $f_1$ to $f_2$ transition and compared to ideal output.

The result can be as simple as switching the DDS from $f_1$ to $f_2$ at a phase that is not zero but commensurate with the phase shift within the TF from the input to the resonant capacitor.

Reduction or Elimination of the Settling Time $P_2$

DDS 12 is deterministic as it is digital, and the only uncertainties from DDS 12 is the time jitter caused in the clocking of DDS 12. TF resonator 20 on the other hand is an analog circuit that is subject to temperature fluctuations and component aging effects. The phase shift of TF resonator 20 relative to DDS 12 will therefore vary a bit, as will the varactor capacitance and analog bias circuit. This may be addressed with a calibration circuit that is built into the DDS-TF system as discussed later.

Figure 11:
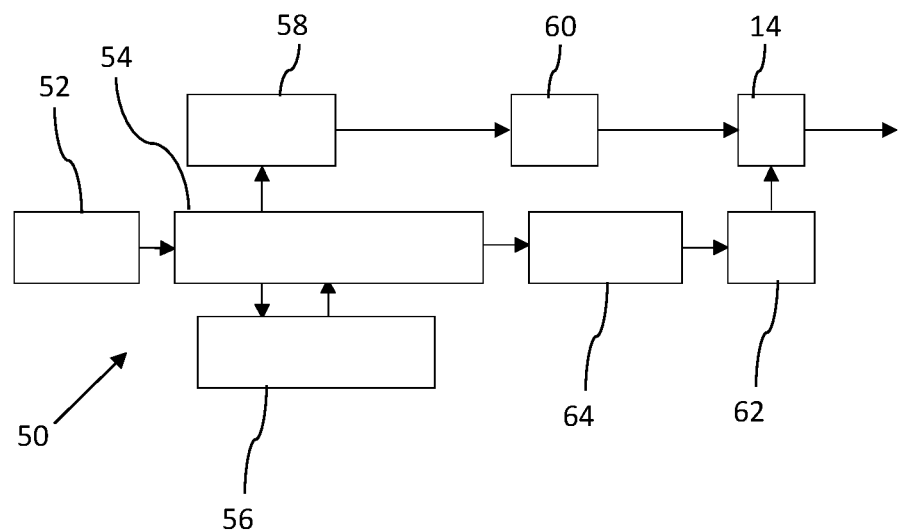
FIG. 11 is a schematic diagram of DDS-TF operation for the tightly coupled architecture using an internally modified DDS.
Figure 12:
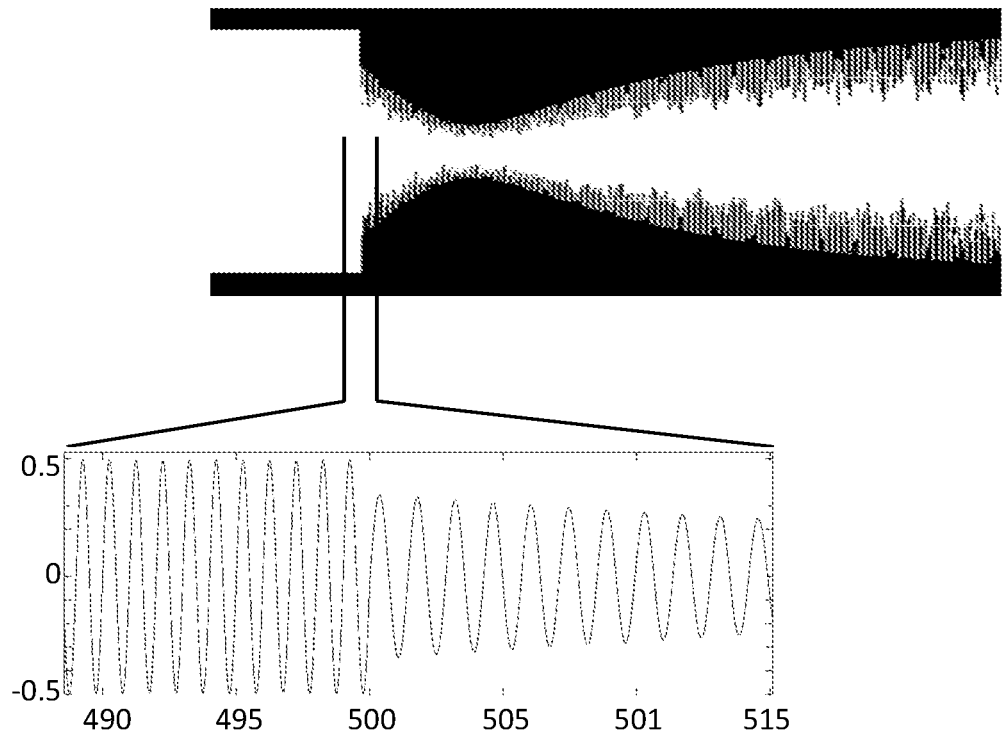
FIG. 12 is a plot of output voltage of the resonator. Top is the complete response and bottom is the closeup where it is evident that the frequency changes instantly a t=500.

With a tightly coupled architecture, the DDS may control a number of features that result in the reduction or elimination of the $P_2$ settling time. A block diagram of the overall DDS-TF system 50 is shown in FIG. 11. The input 52 is $\{f_1, f_2, t\}$ where $f_1$ is the start frequency, $f_2$ is the end frequency and t is the time of frequency transition. This goes into the DDS stepping algorithm 54 that also draws parameter data from the stored calibration tables 56 that were previously populated during on the calibration procedure discussed above in the TF frequency shifting calibration procedure discussed above.

To minimize the settling time $P_2$ of the DDS-TF (see FIG. 4), the conventional DDS function (DDS stepping algorithm 54, DDS ROM 58 and DAC 60) may be tightly coupled with TF 14. Additionally, a synchronous TF control DAC 62 and TF 14 may be implemented. With this tight coupling, DDS stepping algorithm 54 may be used to coordinate the control of both the DDS digital sequence generation as well as the TF frequency control 64 (generally in the form of a DAC analog bias voltage that controls the varactor diode).

Impact of Tight Coupling Phase Control

Referring to FIG. 4, it may be noted that the long period of $P_2$ in which the frequency of the resonator of $f_2'$ is slightly different than the frequency of the DDS at $f_2$. This results in the single period of beating of $f_2$ and $f_2'$, starting at t=500 before the energy of the $f_2'$ eventually decays at about t=550, and $f_2$ builds based on the DDS excitation.

Figure 13:
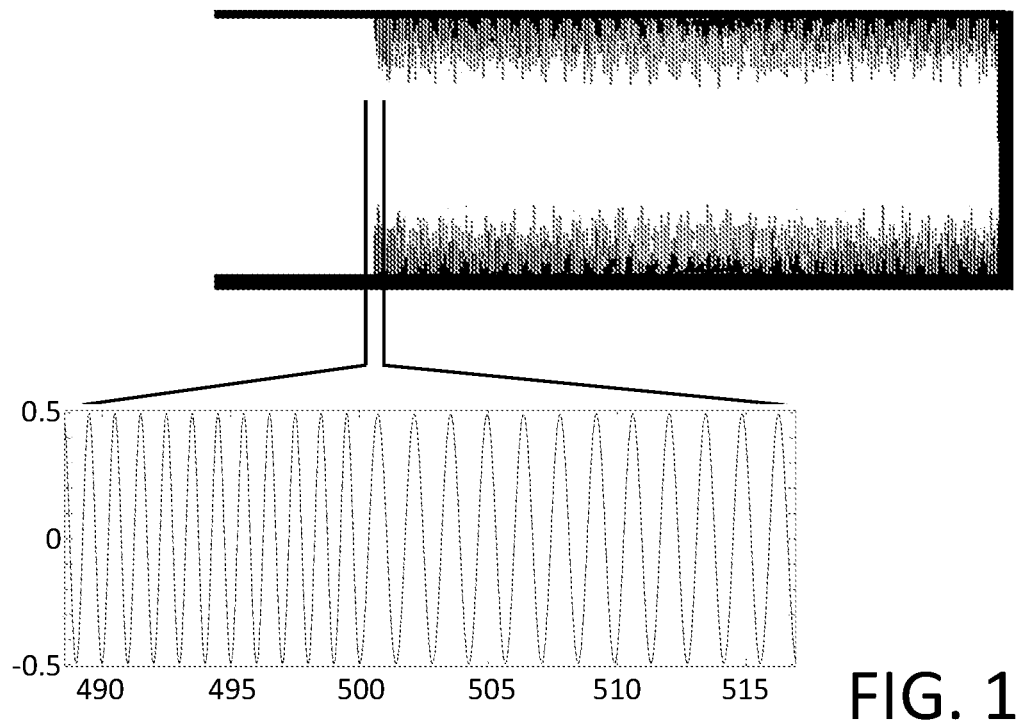
FIG. 13 is a plot of output signal voltage of the resonator. Top is the complete response and bottom is the closeup where it is evident that the frequency changes instantly at t=500.

Now consider tuning using the phase changed at t=500 of the first segment at $f_1$ and then add a phase change to the second segment at $f_2$. FIG. 13 shows the result after some iterative tuning, where values of the two phases were taken to determine where a continuous signal was achieved without interruption due to elimination of the transient that was observed in the non-tuned FIG. 12 example. These graphs depict a near instant change from $f_1$ to $f_2$ that is continuously filtered by the resonator.

Referring to FIG. 4, during the transition period of $0<t<T$, the RF frequency will transition between $f_1$ and $f_2$. However, as the bias voltage transition initiation time is accurately known, the instantaneous frequency and phase will be known throughout the transition. As the phase is continuously changing, the change in bias voltage and hence the change in the capacitance will occur continuously and not just at the zero crossings of the capacitor voltage. The consequence of this is that the energy added to or subtracted from the resonator energy will be modulated. At the end of the transition period, the phase of the $f_2$ signal and the energy may be known, and therefore the DDS amplitude and phase to synchronize with this residual signal is also known. Thereby it is possible to facilitate a smooth frequency transition from $f_1$ to $f_2$ wherein the frequency changes during the transition period are predictable and without further transition distortions after the start of the $f_2$ epoch.

Calibration of the Tightly Coupled DDS-TF

Figure 14:
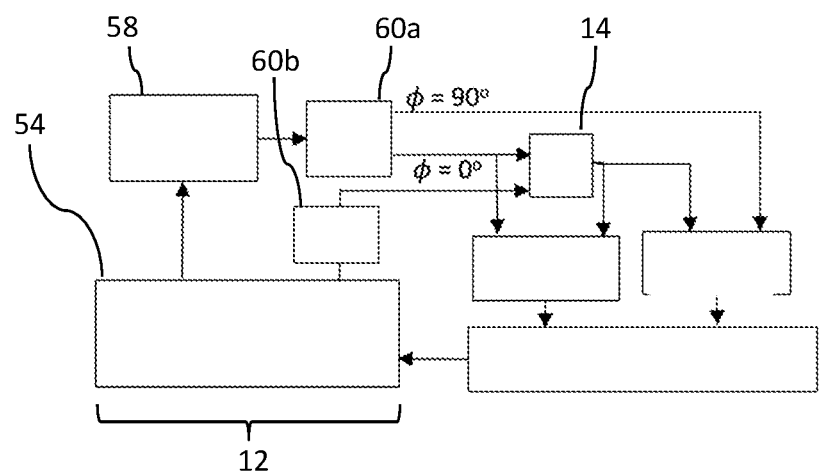
FIG. 14 is a schematic diagram of a DDS-TF calibration loop for the tightly coupled architecture using an internally modified DDS.

Referring to FIG. 14, a calibration circuit is shown that may be used to calibrate the DDS 12 and TF 14 directly. In this example, the calibration may start with the range of frequencies that is anticipated. DDS 12 is shown with first and second DACs 60a and 60b. With the additional DAC channel, the DDS 12 may be used to generate a pair of outputs at a given frequency that are separated by 90 degrees. The outputs of the DDS 12 and TF 14 may be compared using multipliers 65 and a low pass filter and sampling block 67. With these, the response of TF 14 to the DDS stimulation at the set of calibration frequencies can be determined as a complex phasor. The TF response may be optimized for each frequency for a given target Q. These control voltages are noted along with the magnitude and phase shift of the response. In this way the TF transfer function may be characterized as a function of the control voltages.

With the TF statically characterized it is possible to precisely predict how a step change in the DDS frequency output will behave as it passes through the TF. Elaborating slightly, the DDS output is a sinusoidal signal with a frequency that changes instantaneously from $f_1$ to $f_2$ during $P_1$ and is constant at $f_2$ during $P_2$. As the periods of $1/f_1$ and $1/f_2$ are both short relative to the interval of $P_1$ or $P_2$, it is meaningful to generate the quadrature component of the DDS over $P_1$ and $P_2$. The TF output may then be demodulated in terms of these quadrature DDS generated components. This results in a sequence of complex valued phasor samples that can be analyzed in terms of phase and amplitude distortions of the TF output. The key is that the DDS output is fully deterministic, and in quadrature, such that from the complex phasor measurements it is possible to reconstruct the TF output in both $P_1$ and $P_2$ intervals. This can then be compared with the desired output from which the fitness of the parameters can be quantified.

With this, the DAC control voltages, phase of the $f_1$ at the transition point and phase of $f_2$ as it starts can be set to minimize the transient response. The DDS 12 can then generate the $f_1$ to $f_2$ transition and the actual transition measured based on the low pass filtering and sampling feedback. There can then be an iterative optimization loop where parameters of the DDS stepping algorithm can be optimized Once complete, these parameters are stored in the calibration tables.

With respect to timing issues, it is worth noting that a current DDS may be clocked at a rate of several GHz so that the DAC may read out new samples every few hundred picoseconds. All that is required of the DDS is to synthesize a DAC analog voltage output that drives the TF bias voltages and the RF input. Hence the resolution of the control input to the TF may be sub-nanoseconds.

Further, although the DDS-TF control may be open loop during run time, during calibration, this control loop is sensed and then calibration tables may be updated. Ultimately the calibration table output may generate the sequence of digital samples required for the DDS to execute the upcoming $f_1$ to $f_2$ event. As such, the procedure may be implemented without additional functionality of the DDS.

The calibration procedure detects the end phase of $f_1$ and the start phase of $f_2$. Additionally, the total transition period of $T_s$ may be adjusted as the tightly coupled DDS will control the DAC to set the varactor bias voltage directly. The calibration circuit of FIG. 14 may then be used to determine the optimum set of parameters to facilitate the transition from $f_1$ to $f_2$ and thereby eliminate $P_2$.

The set of parameters may be determined as:
1. DDS phase of the $f_1$ signal at t=0 (start of the transition time from $f_1$ to $f_2$)
2. The deterministic value of T (where the frequency has finished changing from $f_1$ to $f_2$)
3. DDS phase of the $f_2$ signal at t=T (the end of frequency period $P_1$)
4. Setting of the resonator frequency $f_2'$ to coincide closely with $f_2$
5. Setting the Q of the active feedback TF such that the amplitude of x(t) stays at a constant amplitude A Transitioning to Steady State $f_2$ The objective function of the calibration optimization is based on the desire to transition from $f_1$ to $f_2$ with the interval of $P_1+P_2$ minimized A constraint is that leading up to the transition which starts at t=0, the output of the TF may be a steady state sinusoidal waveform with a frequency of $f_1$ and no discernible amplitude or phase distortion, where 'discernible' is in the context of a specific application. The output of the TF after $t=T_s$ (in FIG. 4) is likewise a steady state sinusoidal waveform with a frequency of $f_2$ and no discernible amplitude or phase distortion.

The reason for these constraints is that phase and frequency distortions typically degrade the coherency of the RF processing. For instance:

1. In a transceiver for data communications, frequency and phase distortion will degrade the processing gain of the communication link.
2. In a radar, frequency and phase distortion will reduce the resolution of the overall radar processing.

In the optimization, $P_1$ and $P_2$ are variables, and it may be advantageous to increase $P_1$ slightly to achieve a reduction in $P_2$.

Finally, due to residual noise present in any processing system there will be a finite residue of phase and amplitude distortion in the $f_1$ and $f_2$ regions. Hence the constraint of the objective is more of an inequality that should be based on a tolerable limit of the phase and amplitude distortion.

A useful observation in this context is that the change in capacitance with time during $P_1$ results in an additional loss term in the resonator. This may be mitigated by implementing a constant signal amplitude method to minimize or reduce the $P_2$ transition interval to zero.

As a simulation example, refer to the circuit of a coupled resonator as in FIG. 7. Note that the load resistance limits the Q of the resonator. The active feedback bandpass filter can be represented by the simple resonator with a higher Q. On the right is a DDS signal that simulates a change in frequency at t=500. Hence there is time to settle to the first frequency $f_1$ and then at t=500 we abruptly change the frequency of the DDS and the varactor capacitor at the same time. The step change into the varactor goes from a value of b1 to b2 at t=500. Now the model of the capacitor is such that $d_i/d_t=v/C(t)$. It does not account for the details of the sudden change in energy of the capacitor as C changes for the same voltage. Since the varactor capacitor value is in picofarads, this small energy impulse is readily supplied by the bias circuit at t=500.

Constant Signal Amplitude Transition Interval $P_2$

Figure 15:
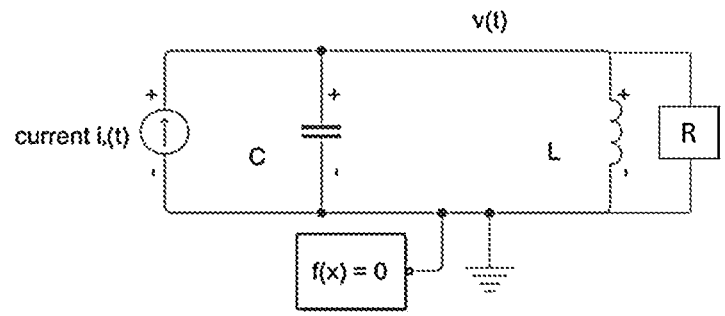
FIG. 15 is a schematic diagram of a lossless ideal resonant LC tank with resistance in parallel.

For this discussion, assume a parallel LRC resonator driven by a current source as in FIG. 15. Here R is the parallel resistance of the resonator which represents the finite Q of the resonator and the losses.

The source current $i_s$ may be defined by $$i_s = i_c + i + \frac{v}{R}$$

where $i_c$ is the capacitor current and v is the voltage across the parallel resonator. Now the inductor does not change with time and therefore $$v = L\frac{di}{dt}$$

The capacitor can change with time and therefore $$i_c = C\frac{dv}{dt} + v\frac{dC}{dt}$$

It may be assumed that C is a function of the bias voltage which is much larger than the signal voltage. As such the change in bias voltage is the dominant cause of the change in C. Putting this together $$i_s - i = C\frac{dv}{dt} + v\frac{dC}{dt} + \frac{v}{R}$$

and then $$i_s - i = C\frac{dv}{dt} + v\frac{dC}{dt} + \frac{v}{R}$$

Ordering $$i_s - i = C\frac{dv}{dt} + v\left(\frac{dC}{dt} + \frac{1}{R}\right)$$

$$i_s - i = C\frac{dv}{dt} + v\left(\frac{dC}{dt} + \frac{1}{R}\right)$$

From $$v = L\frac{di}{dt}, \frac{dv}{dt} = L\frac{d^2i}{dt^2}$$

which holds as L is a constant, then $$i_s - i = CL\frac{d^2i}{dt^2} + L\frac{di}{dt}\left(\frac{dC}{dt} + \frac{1}{R}\right)$$

From here it can be seen that the damping coefficient is given as $$\frac{2D}{\sqrt{LC}} = \frac{1}{C}\left(\frac{dC}{dt} + \frac{1}{R}\right)$$

or $$\frac{1}{Q\sqrt{LC}} = \frac{1}{C}\left(\frac{dC}{dt} + \frac{1}{R}\right)$$

this becomes $$Q = \frac{1}{\sqrt{LC}}\frac{C}{\frac{dC}{dt} + \frac{1}{R}} = \sqrt{\frac{C}{L}}\frac{1}{\frac{dC}{dt} + \frac{1}{R}}$$

Hence when C increases with time the Q decreases. When C decreases with time then Q increases. Consider now the change in frequency from $f_1$ to $f_2$ where $f_1 > f_2$ so that C increases with time with a dropping bias voltage. During the transition, Q will drop as $$\frac{dC}{dt} > 0.$$

However, suppose R is modified during the transition such that $$\frac{dC}{dt} + \frac{1}{R} = const$$

Figure 16:
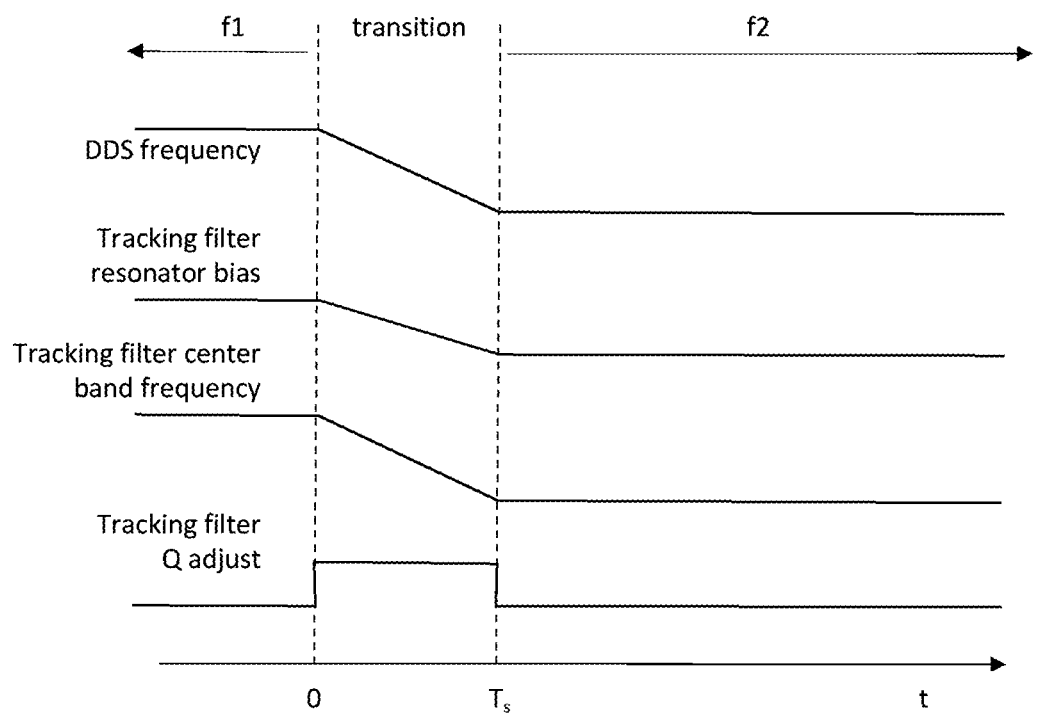
FIG. 16 is a plot showing the transition from a frequency of $f_1$ to $f_2$ with a transition epoch from $0<t<T_s$, and in particular (a) a DDS frequency of digital output, (b) the tracking filter resonator varactor bias, (c) the tracking filter center band frequency, and (d) the tracking filter Q-adjustment for the variable tracking filter such that the tracking filter has a constant or near constant signal gain throughout the $f_1$, transition, and $f_2$ epochs.

Now a constant Q may be maintained throughout the transition and then the amplitude of the signal should not change during the transition period $P_2$ as shown in FIG. 16.

Alternately, the signal amplitude out of the DDS may be adjusted to achieve constant amplitude which might not be convenient, as a result of a design trade.

A transition from an initial frequency of $f_1$ to a final frequency of $f_2$ may be considered. This has led to method of optimizing the transition by reducing $P_2$ towards zero, and by constraining the amplitude to be constant throughout the transition interval to take the $P_2$ transition period to zero.

Figure 17:
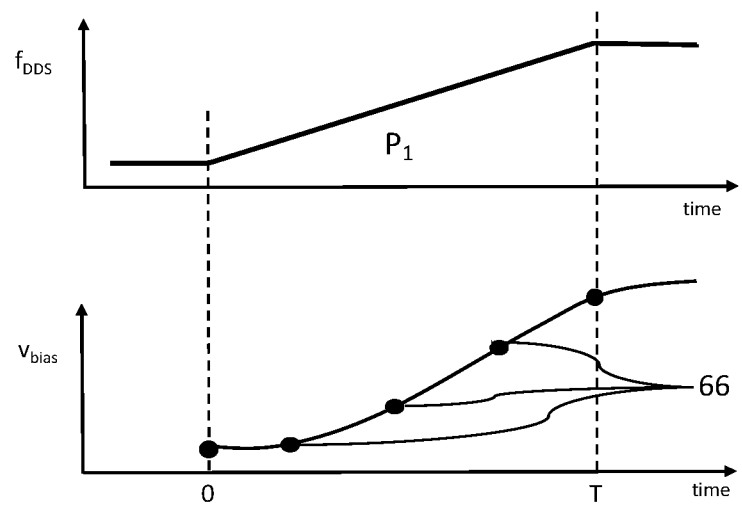
FIG. 17 is a plot showing the calibration of a notional DDS frequency modulation with multiple points of calibration.

If the DDS-TF are required to perform a finite number of such transitions, then calibration may be done for each $f_1$ to $f_2$ pair. However, this set of frequency pairs can grow to a large enough number that pairwise calibration is inconvenient. However, the calibrations may be very similar and therefore a set of empirical relations can be abstracted out of the set of pairwise calibrations. There may be a large number of algorithms for fitting empirical calibration relations to a set of calibration points of $\{f_1$ to $f_2\}$, examples of which are identified as points 66 on FIG. 17. The multiple points 66 of calibration generally correspond to the varactor bias voltage time constant, which correspond with intermediate states that may be used during normal operation to minimize transition times from $f_1$ to $f_2$. This may depend on a given implementation or application. Considerations of the application-specific calibrations is beyond the scope of the present discussion.

It may also be noted that the transition period of $P_1$ is generally considered a nuisance but in other applications, a calibrated linear frequency chirp, or more generally a general frequency modulation, may be required from the DDS. Clearly the $P_1$ interval can be expanded to include either a linear frequency chirp or a general frequency modulation.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings, but should be given the broadest interpretation consistent with the description as a whole.

What is claimed is:

1. A method of tuning an RF signal, the method comprising the steps of:
   producing a first signal at a first frequency using a digital sequence generator;
   filtering the first signal using a frequency-tunable tracking filter that is tuned to the first frequency, the tracking filter comprising one or more variable resonators;
   tuning the tracking filter from the first frequency to a second frequency over a transition period; and
   tuning the first signal to the second frequency by causing the digital sequence generator to transition between two or more states during the transition period, the two or more states being selected such that, immediately after the transition period, an output of the tracking filter substantially matches a desired steady state at the second frequency.

2. The method of claim 1, wherein each of the one or more variable resonators comprises at least one varactor having a capacitance that is controlled by a bias voltage.

3. The method of claim 2, wherein the tracking filter is tuned from the first frequency to the second frequency by changing the bias voltage.

4. The method of claim 1, wherein each of the one or more variable resonators comprises an active feedback loop.

5. The method of claim 4, wherein the tracking filter is Q-tunable, and the method further comprises the step of, during the transition period, tuning the Q of the tracking filter such that a signal amplitude at the second frequency is maintained relative to the first frequency.

6. The method of claim 5, further comprising the step of tuning the Q of the tracking filter to produce a constant signal amplitude during the transition period.

7. The method of claim 1, wherein each of the one or more variable resonators comprises at least one variable capacitor.

8. The method of claim 1, wherein each of the first frequency and the second frequency are greater than 100 MHz and the transition period is about 500 nanoseconds or less.

9. The method of claim 1, wherein the two or more states are determined by calibrating the digital sequence generator and the tracking filter, and further comprising the step of storing the two or more states in a calibration table, the calibration table comprising the two or more states corresponding to a plurality of first frequency and second frequency pairs.

10. The method of claim 9, wherein the two or more states are coordinated with changes in the tracking filter during the transition period.

11. The method of claim 9, wherein calibrating the digital sequence generator and the tracking filter comprises generating a feedback signal based on samples of at least the first signal and the output of the tracking filter, the samples being obtained at least during the transition period.

12. The method of claim 9, wherein calibrating the digital sequence generator and the tracking filter comprises iteratively applying an optimization algorithm to determine the two or more states for each first frequency and second frequency pair.

13. The method of claim 9, wherein the set of first frequency and second frequency pairs is used to determine an empirical relationship that estimates the two or more states for an additional first frequency and second frequency pair that is not stored in the calibration table.

14. The method of claim 1, wherein the two or more states are defined by differences in phase, amplitude, frequency, or combinations thereof.

* * * * *